(12) United States Patent
Minemura et al.

(10) Patent No.: US 8,958,230 B2
(45) Date of Patent: Feb. 17, 2015

(54) NONVOLATILE SEMICONDUCTOR MEMORY DEVICE

(71) Applicant: Kabushiki Kaisha Toshiba, Tokyo (JP)

(72) Inventors: Yoichi Minemura, Yokkaichi (JP); Takayuki Tsukamoto, Yokkaichi (JP); Hiroshi Kanno, Yokkaichi (JP); Takamasa Okawa, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 87 days.

(21) Appl. No.: 13/778,840

(22) Filed: Feb. 27, 2013

(65) Prior Publication Data

US 2014/0063889 A1    Mar. 6, 2014

Related U.S. Application Data

(60) Provisional application No. 61/695,346, filed on Aug. 31, 2012.

(51) Int. Cl.
*G11C 5/06* (2006.01)
*G11C 13/00* (2006.01)
*G11C 8/08* (2006.01)

(52) U.S. Cl.
CPC .............. *G11C 13/0002* (2013.01); *G11C 5/06* (2013.01); *G11C 8/08* (2013.01); *G11C 13/00* (2013.01); *G11C 13/0023* (2013.01); *G11C 13/0028* (2013.01); *G11C 13/003* (2013.01); *G11C 2213/72* (2013.01)
USPC ........................................... 365/63; 365/148

(58) Field of Classification Search
None
See application file for complete search history.

(56) References Cited

U.S. PATENT DOCUMENTS

| 6,856,572 | B2 | 2/2005 | Scheuerlein et al. |
| 7,486,587 | B2 | 2/2009 | Scheuerlein et al. |
| 2009/0273961 | A1 | 11/2009 | Ono et al. |
| 2010/0046274 | A1 | 2/2010 | Tsuchida et al. |
| 2011/0044090 | A1* | 2/2011 | Terada et al. ................. 365/148 |

FOREIGN PATENT DOCUMENTS

| JP | 2009-271985 | 11/2009 |
| JP | 2009-545837 | 12/2009 |
| JP | 2010-49730 | 3/2010 |
| JP | 2011-44193 | 3/2011 |

* cited by examiner

*Primary Examiner* — James G Norman
(74) *Attorney, Agent, or Firm* — Oblon, Spivak, McClelland, Maier & Neustadt, L.L.P.

(57) ABSTRACT

A nonvolatile semiconductor memory device according to an embodiment comprises: a memory cell array including first lines, second lines, and memory cells provided at each of intersections of the first lines and the second lines; and a control unit including a row control circuit, a first column control circuit provided on a side of one ends of the second lines, and a second column control circuit provided on a side of the other ends of the second lines, the control unit, during an access operation, controlling a potential of the first lines and the second lines such that a bias, which is lower than that applied to a certain unselected memory cell, is applied to those of unselected memory cells that are located more toward a center of the memory cell array in the column direction than the certain unselected memory cell.

14 Claims, 10 Drawing Sheets

NONVOLATILE SEMICONDUCTOR MEMORY DEVICE

CROSS-REFERENCE TO RELATED APPLICATION

This application is based upon and claims the benefit of priority from the prior U.S. Provisional Application 61/695,346, filed on Aug. 31, 2012, the entire contents of which are incorporated herein by reference.

BACKGROUND

1. Field

Embodiments of the present invention relate to a nonvolatile semiconductor memory device.

2. Description of the Related Art

In recent years, ReRAM (Resistive RAM) has been receiving attention as a technology for realizing an even higher level of integration in nonvolatile semiconductor memory devices.

A memory cell array in this ReRAM is configured by a plurality of word lines and a plurality of bit lines that intersect one another, and memory cells provided at each of intersections of these plurality of word lines and plurality of bit lines.

When it is desired to perform data write to these memory cells, for example, a potential of a selected word line and a selected bit line must be set such that a bias required for data write is applied to a selected memory cell, and a potential of unselected word lines and unselected bit lines must be set such that a bias applied to unselected memory cells is small enough to prevent data being written to said unselected memory cells.

However, adopting such a bias state in the memory cell array results in sneak currents flowing between the unselected word lines and the selected bit line or the selected word line and the unselected bit lines via the unselected memory cells. As a result, a voltage drop induced by these sneak currents causes power consumption during an access operation to increase.

DETAILED DESCRIPTION

A nonvolatile semiconductor memory device according to an embodiment comprises: a memory cell array including a plurality of first lines extending in a row direction, a plurality of second lines extending in a column direction, and a plurality of memory cells provided at each of intersections of the plurality of first lines and the plurality of second lines; and a control unit including a row control circuit configured to control a potential of the plurality of first lines, a first column control circuit provided on a side of one ends of the plurality of second lines and configured to control a potential of a plurality of those of said plurality of second lines that are aligned in even-numbered positions, and a second column control circuit provided on a side of the other ends of the plurality of second lines and configured to control a potential of a plurality of those of said plurality of second lines that are aligned in odd-numbered positions, when, of the plurality of memory cells, a memory cell which is to be an access target is assumed to be a selected memory cell and the other memory cells are assumed to be unselected memory cells, the control unit, during an access operation, controlling a potential of the plurality of first lines and the plurality of second lines such that a lower bias, which is lower than that applied to a certain unselected memory cell, is applied to those of the unselected memory cells that are located more toward a center of the memory cell array in the column direction than the certain unselected memory cell.

A nonvolatile semiconductor memory device according to embodiments is described below with reference to the accompanying drawings.

First Embodiment

First, an overall configuration of a nonvolatile semiconductor memory device according to a first embodiment is described.

Figure 1:
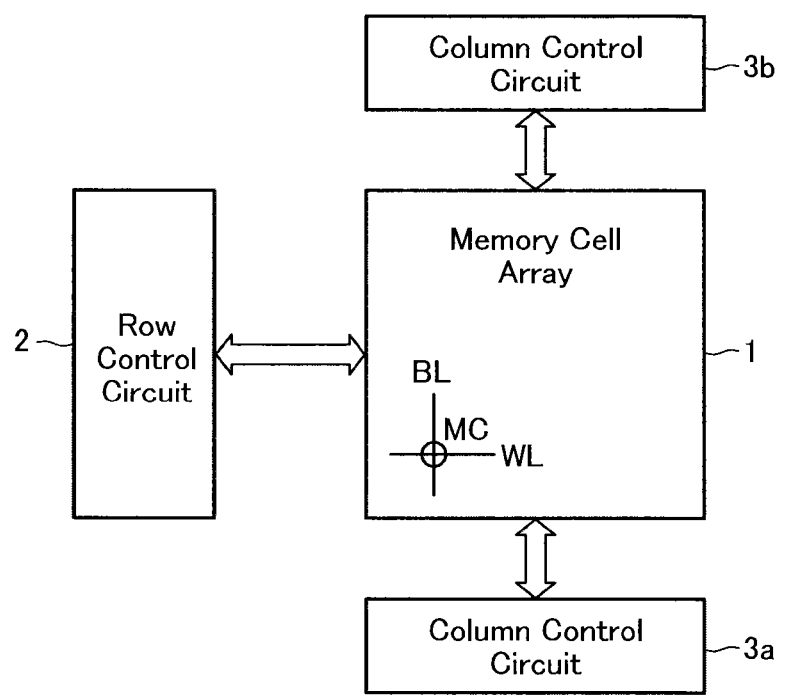
FIG. 1 is a functional block diagram of a nonvolatile semiconductor memory device according to a first embodiment.

FIG. 1 is a functional block diagram of the nonvolatile semiconductor memory device according to the present embodiment.

This nonvolatile semiconductor memory device includes a memory cell array 1 configured from a plurality of word lines WL (first lines) and a plurality of bit lines BL (second lines) that intersect one another, and a plurality of memory cells MC provided at each of intersections of these plurality of word lines WL and plurality of bit lines BL.

In addition, this nonvolatile semiconductor memory device includes a row control circuit 2 for controlling the word lines WL and column control circuits 3a (first column control circuit) and 3b (second column control circuit) for controlling the bit lines BL. The column control circuit 3a controls those of the plurality of bit lines BL that are located in even-numbered positions (below, denoted "BLe"), and the column control circuit 3b controls those of the plurality of bit lines BL that are located in odd-numbered positions (below, denoted "BLo"). Operation of a control unit including these row control circuit 2 and column control circuits 3a and 3b results in the nonvolatile semiconductor memory device according to the present embodiment performing access operations (data erase, data write, and data read) on the memory cells MC.

Next, a circuit configuration of the memory cell array 1 is described.

Figure 2:
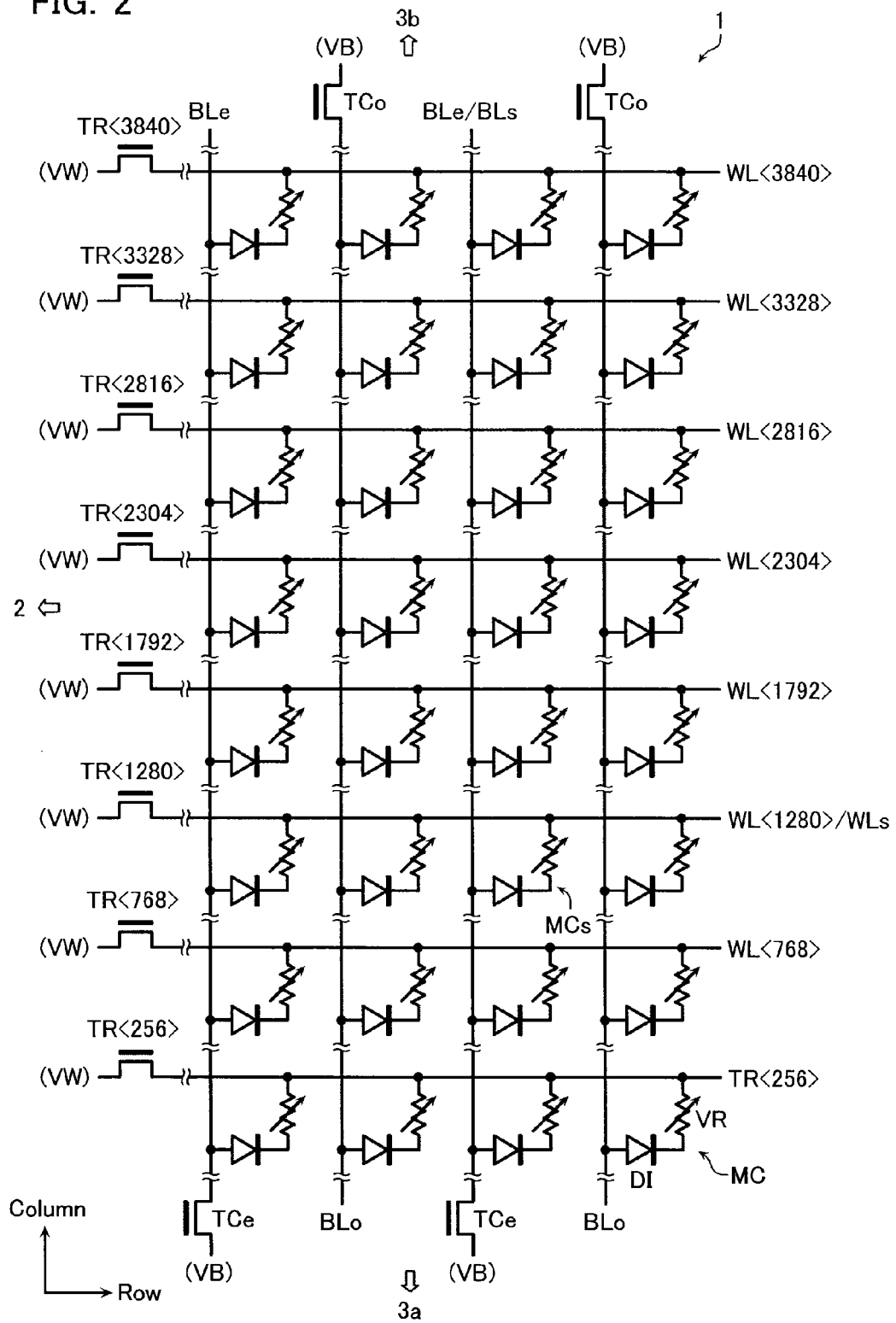
FIG. 2 is a circuit diagram of a memory cell array in the nonvolatile semiconductor memory device according to the same embodiment.

FIG. 2 is a circuit diagram of the memory cell array 1.

The memory cell array 1 comprises the plurality of word lines WL extending in a row direction and aligned in a column direction, and the plurality of bit lines BL extending in the column direction and aligned in the row direction. In the case of FIG. 2, there are 4096 of the word lines WL. As mentioned before, the memory cells MC are provided at intersections of the word lines WL and the bit lines BL. Each of the memory cells MC is configured from a variable resistance element VR and a rectifier element connected in series. In the case of FIG. 2, as an example, a diode DI is employed as the rectifier element. Moreover, each of the memory cells MC has one of the bit lines BL connected to an anode side of the diode DI and one of the word lines WL connected to a cathode side of the diode DI.

Each of the word lines WL has one end connected to a select transistor TR. The row control circuit 2 adjusts a potential VW of the word lines WL via these select transistors TR. Note that these plurality of select transistors TR are included in the control unit.

In addition, each of the bit lines BL has one end connected to a select transistor TC, similarly to the word lines WL. Now, the select transistors TC connected to the even-numbered bit lines BLe (below, denoted "TCe") are connected to lower ends of the bit lines BLe on the paper sheet of FIG. 2. The column control circuit 3a controls a potential VB of the bit lines BLe via these select transistors TCe. Note that these plurality of select transistors TCe are included in the control unit. Similarly, the select transistors TC connected to the odd-numbered bit lines BLo (below, denoted "TCo") are connected to upper ends of the bit lines BLo on the paper sheet of FIG. 2. The column control circuit 3b controls a potential VB of the bit lines BLo via these select transistors TCo. Note that these plurality of select transistors TCo are included in the control unit.

Terminology and reference symbols employed below are now described. In some cases, a memory cell which is to be an access target is called a "selected memory cell", and the other memory cells are called "unselected memory cells". In some cases, the word line connected to the selected memory cell is called a "selected word line" (selected first line) and the other word lines are called "unselected word lines" (unselected first lines), and the bit line connected to the selected memory cell is called a "selected bit line" (selected second line) and the other bit lines are called "unselected bit lines" (unselected second lines). In some cases, a potential of the selected word line is called a "selected word line potential" and a potential of the unselected word lines is called an "unselected word line potential", and a potential of the selected bit line is called a "selected bit line potential" and a potential of the unselected bit lines is called an "unselected bit line potential".

In addition, a word line aligned i-th in the column direction is assumed to be allocated a row address i. Accordingly, the word line, potential of the word line, and select transistor corresponding to the row address i are each denoted having "<i>" appended to their reference symbols. The selected memory cell, selected word line, selected bit line, selected word line potential, and selected bit line potential are each denoted having "s" appended to their reference symbols. Similarly, the unselected memory cells, unselected word lines, unselected bit lines, unselected word line potential, and unselected bit line potential are each denoted having "u" appended to their reference symbols.

Next, an access operation on the memory cell array 1 is described using FIG. 2. Described herein is an access operation in the case where the memory cell MCs connected to the word line WL<1280> and the bit line BLs is assumed to be the selected memory cell.

When accessing the selected memory cell MCs, a potential of the selected word line WLs (WL<1280>) is set to for example VWs=0 V and a potential of the unselected word lines WL (WL<256> and so on) is set to for example VWu=8.0 V by the row control circuit 2, and a potential of the selected bit line BLs is set to for example VBs=6.5 V and a potential of the unselected bit lines BL is set to for example VBu=0 V by the column control circuits 3a and 3b.

When the memory cell array 1 is set to the above-described bias state, a bias directed in a forward direction of the diode DI is applied to the selected memory cell MCs. This results in the variable resistance element VR in the selected memory cell MCs being applied with a voltage of 6.5 V, whereby a resistance state of the variable resistance element VR undergoes transition.

On the other hand, the unselected memory cells MCu connected between the unselected word lines WLu and the unselected bit lines BLu are applied with a bias directed in a reverse direction of the diode DI (below, called "reverse direction bias"). As a result, the variable resistance element VR in each of the unselected memory cells MCu connected between the unselected word lines WLu and the unselected bit lines BLu is not applied with a voltage sufficient to cause its resistance state to undergo transition.

The unselected memory cells MCu connected between the selected word line WLs and the unselected bit lines BLu are not applied with a bias. Moreover, the unselected memory cells MCu connected between the unselected word lines WLu and the selected bit line BLs are applied with a reverse direction bias, but this reverse direction bias is not large enough to cause the resistance state of the variable resistance element VR to undergo transition. Therefore, data does not change in either of these unselected memory cells MCu.

In other words, setting the memory cell array 1 to the above-described bias state allows data write or data erase of only the selected memory cell MCs to be performed, without rewriting data of the unselected memory cells MC.

However, when the memory cell array 1 is set to the above-described bias state, sneak currents flowing into the selected word line WLs via the unselected memory cells MCu occur in the memory cell array 1.

Figure 3:
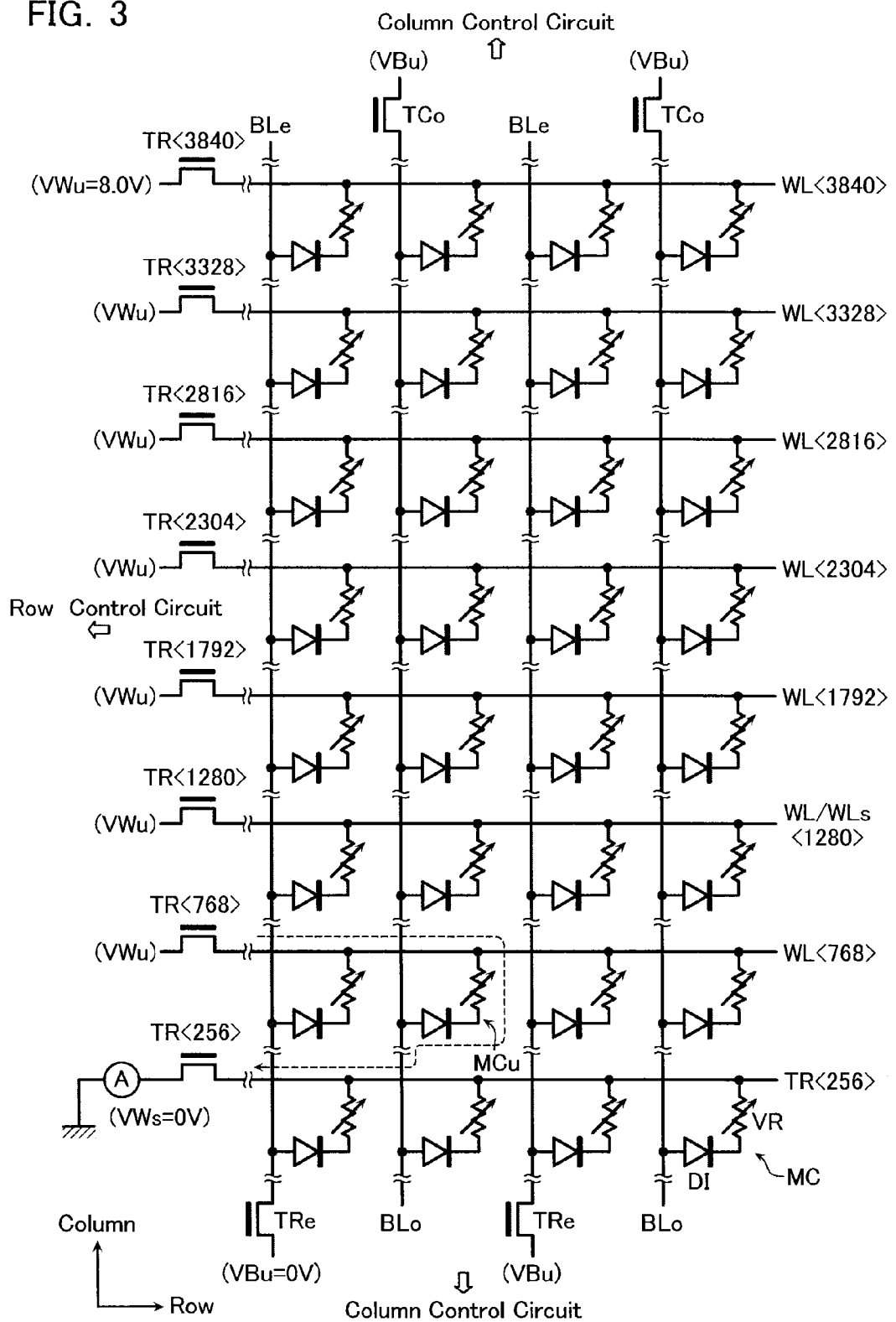
FIG. 3 is a view explaining a method of actual measurement of a sneak current flowing in a selected word line during an access operation.

FIG. 3 is a view explaining a method of actual measurement of a sneak current flowing in the selected word line WLs during the access operation. This view shows the case where a memory cell array having a similar structure to that of the memory cell array 1 in the present embodiment is employed and the word line WL<256> is assumed to be the selected word line WLs.

In performing actual measurement of the sneak current flowing in the selected word line WLs (WL<256> in the case of FIG. 3), an ammeter A is inserted beforehand between the selected word line WLs and a power supply. In addition, the selected word line WLs is set to the selected word line potential VWs=0 and the other unselected word lines WLu are set to the unselected word line potential VWu=8.0 V, and all of the bit lines BL are set to the unselected bit line potential VBu=0 as the unselected bit lines BLu. In this method of actual measurement, all of the bit lines BL are assumed to be unselected bit lines BLu, but considering that even in an actual access operation, almost all of the bit lines BL are unselected bit lines BLu, the effect of this assumption may be ignored.

A reading of the ammeter A in the above-described bias state represents the sneak current flowing in the selected word line WLs.

Figure 4:
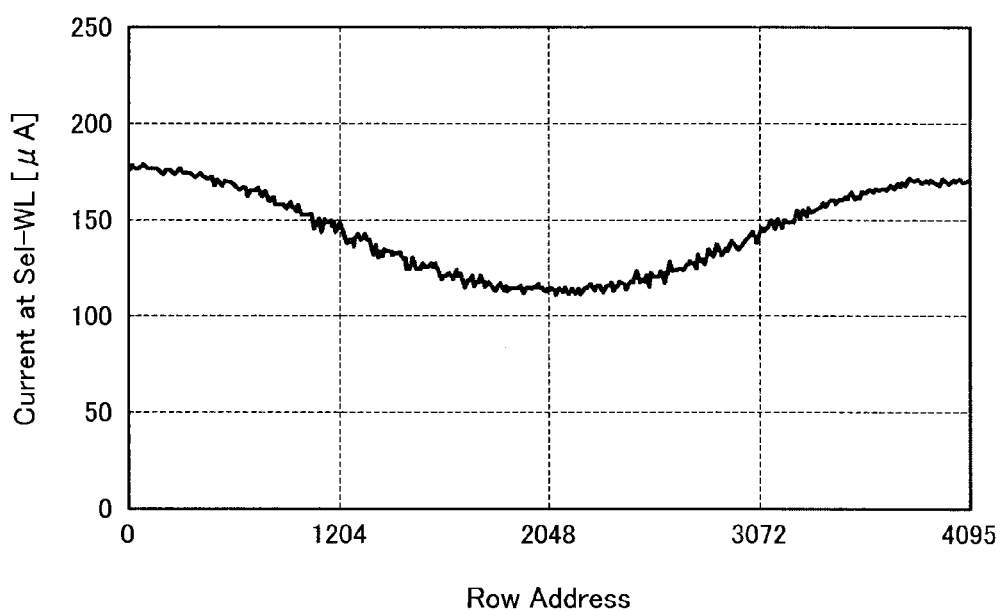
FIG. 4 is a graph showing a relationship between a row address and a current flowing in the selected word line to which this row address is allocated, during the access operation.

FIG. 4 is a graph showing a relationship between the row address and the sneak current flowing in the selected word line WLs corresponding to this row address, obtained by the above-described method of actual measurement.

As is clear from FIG. 4, it may be understood that, in the case of a memory cell array where a voltage is supplied from a different direction to the even-numbered bit lines BLe and the odd-numbered bit lines BLo respectively, the sneak current flowing in the selected word line WLs is smaller the closer to a center of the memory cell array that the selected word line WLs is located in the column direction and larger the further to an outside of the memory cell array that the selected word line WLs is located in the column direction.

In the case of FIG. 4, for example, when the word line WL<2048> is assumed to be the selected word line WLs, only a current of about 120 µA flows in said word line WL<2048>, whereas when the word line WL<0> or the word line WL<4095> is assumed to be the selected word line WLs, a current of about 175 µA flows in these word line WL<0> and word line WL<4095>.

As shown by the broken line in FIG. 3, the sneak current is due to a reverse current flowing in the unselected memory cells MCu located at intersections between each of the unselected bit lines BLu and the selected word line WLs which is to be an object of measurement. Moreover, when focusing on one word line WL, potentials of the plurality of bit lines BLe or the plurality of bit lines BLo at places of intersection with this word line WL are each about the same. Therefore, if the potential of this word line WL is adjusted appropriately based on a position of the word line WL within the memory cell array, the reverse direction bias applied to the unselected memory cells MCu can be reduced, whereby the sneak current can also be reduced.

Accordingly, in the present embodiment, in view of the results of actual measurement in FIG. 4, the potential VWu to which the unselected word lines WL are set is lowered by the row control circuit 2 such that the reverse direction bias applied to the unselected memory cells MCu becomes smaller from the outside toward the center of the memory cell array 1 in the column direction.

Several specific examples of the present embodiment are described below, and for convenience of explanation, the word lines WL<0>~WL<4095> are divided into four groups GWL1~GWL4 from the center toward the outside of the memory cell array 1. A group of the word lines WL<1536>~<2559> to which the row addresses 1536~2559 are allocated is assumed to be GWL1, a group of the word lines WL<1024>~<1535> and WL<2560>~<3071> to which the row addresses 1024~1535 and 2560~3071 are allocated is assumed to be GWL2, a group of the word lines WL<512>~<1023> and WL<3072>~<3583> to which the row addresses 512~1023 and 3072~3583 are allocated is assumed to be GWL3, and a group of the word lines WL<0>~<511> and WL<3584>~<4095> to which the row addresses 0~511 and 3584~4095 are allocated is assumed to be GWL4. The same group division is used also in other embodiments.

Figure 5:
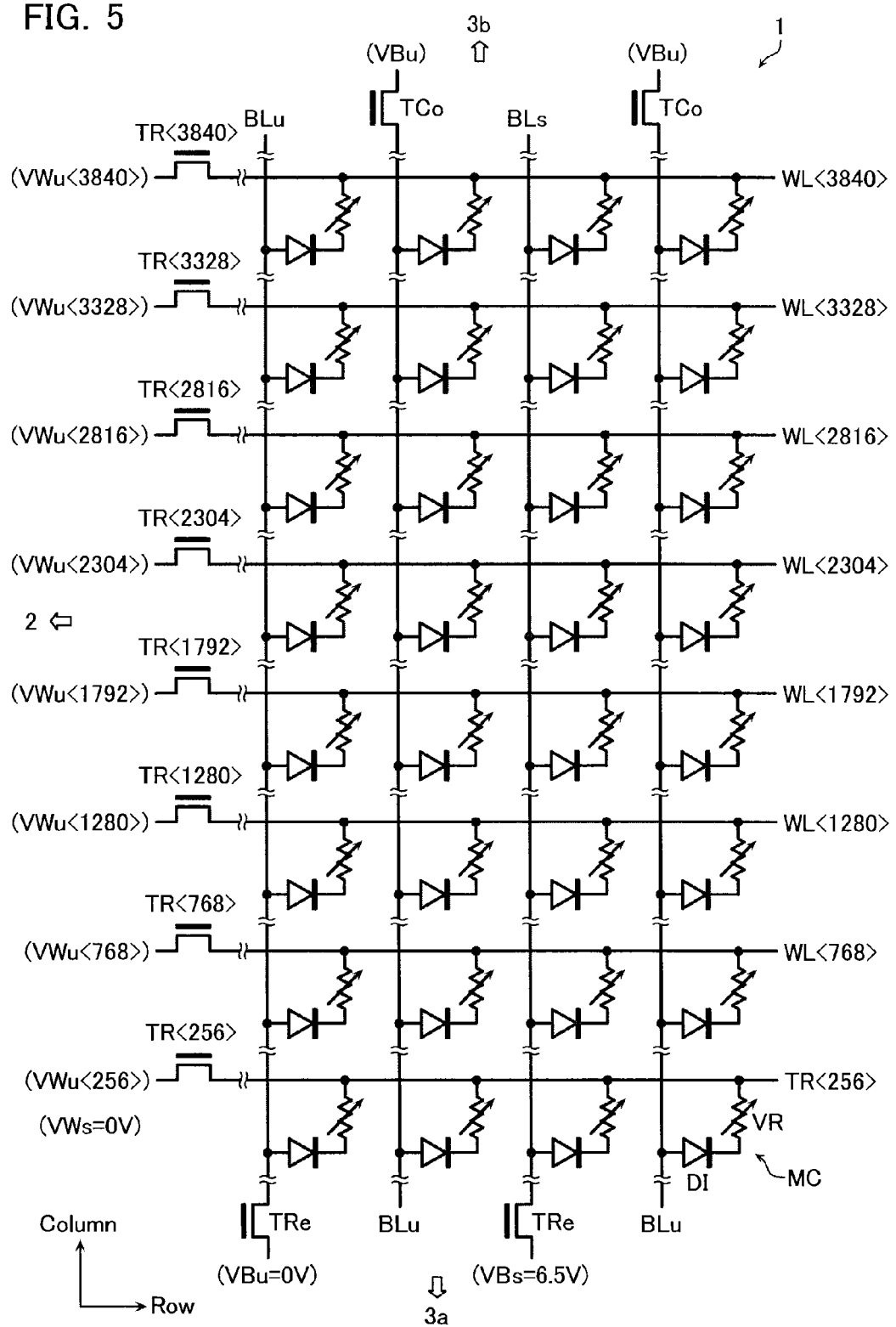
FIG. 5 is a view showing a bias state of the memory cell array in the nonvolatile semiconductor memory device according to the same embodiment.

FIG. 5 is a view showing a bias state of the memory cell array 1 in the present embodiment.

It is assumed that, during the access operation in the specific example described here, the selected word line WLs (not illustrated) is set to the selected word line potential VWs=0 V by the row control circuit 2, and the selected bit line BLs is set to the selected bit line potential VBs=6.5 V and the unselected bit lines BL are set to the unselected bit line potential VBu=0 V by the column control circuits 3a and 3b.

Figure 6:
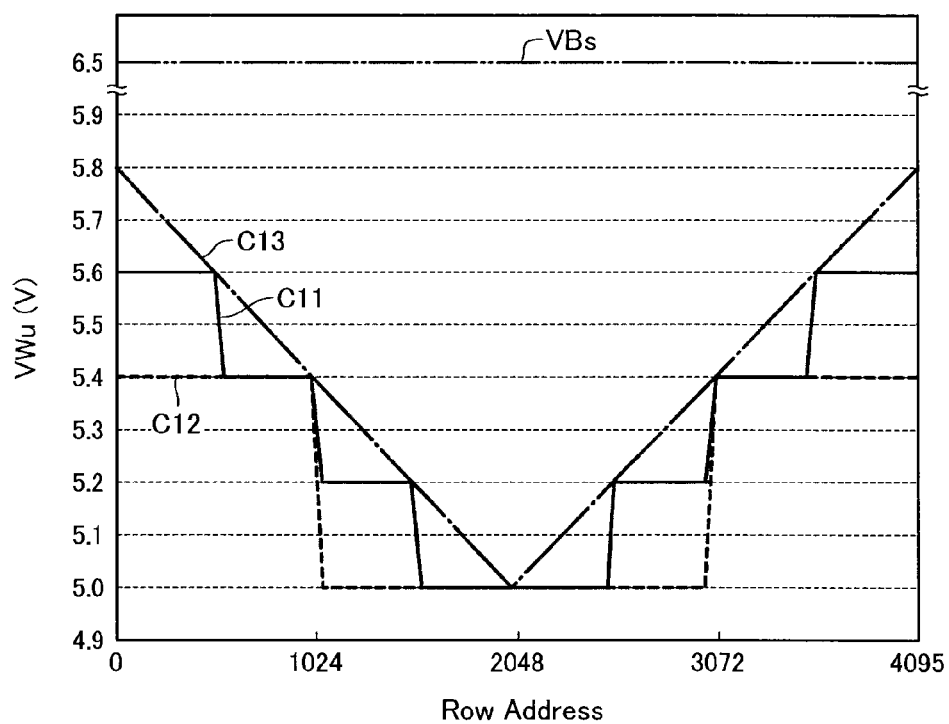
FIG. 6 is a graph showing a relationship between a row address and a potential of an unselected word line to which this row address is allocated, in the nonvolatile semiconductor memory device according to the same embodiment.

Moreover, as shown in FIG. 6, in the present embodiment, the unselected word line potential VWu to which the unselected word lines WLu are set is adjusted by the row control circuit 2.

FIG. 6 is a graph showing a relationship between the row address and the potential VWu of the unselected word line WL to which this row address is allocated.

In the case of specific example C11 in the present embodiment (solid line in FIG. 6), the unselected word lines WLu of group GWL1, the unselected word lines WLu of group GWL2, the unselected word lines WLu of group GWL3, and the unselected word lines WLu of group GWL4 are set to, respectively, a potential VWu=5.0 V, a potential VWu=5.2 V, a potential VWu=5.4 V, and a potential VWu=5.6 V by the row control circuit 2.

In other words, in the case of specific example C11, the potential VWu of the unselected word lines WL is set lower in stages from the outside toward the center of the memory cell array 1 in the column direction. This enables the reverse direction bias applied to the unselected memory cells MC to be lowered and the sneak current arising in the memory cell array 1 to be proportionately lowered compared to the case where all of the unselected word lines WLu are set to the same potential VWu.

In the case of specific example C12 in the present embodiment (broken line in FIG. 6), the unselected word lines WLu of groups GWL1 and GWL2 are set to the potential VWu=5.0 V, and the unselected word lines WLu of groups GWL3 and GWL4 are set to the potential VWu=5.4 V by the row control circuit 2.

In the case of this specific example C12, although adjustment of the reverse direction bias applied to the unselected memory cells MC is coarser than in specific example C11, the potential VWu to which the unselected word lines WLu are set is switched in only two stages, hence a configuration of the row control circuit 2 can be simplified more than in specific example C11.

In the case of specific example C13 in the present embodiment (dashed-single dotted line in FIG. 6), the unselected word line potential VWu with respect to the unselected word lines WLu is set in a range of 5.0~5.8 V by the row control circuit 2 so as to lower continuously from the outside toward the center of the memory cell array 1 in the column direction, irrespective of group GWL.

In the case of this specific example C13, although the unselected word line potential VWu requires to be more finely set hence the configuration of the row control circuit 2 becomes more complicated than in specific example C11, adjustment of the reverse direction bias applied to the unselected memory cells MCu can be more finely performed than in specific example C11.

FIG. 6 was used to show three specific examples C11-C13 where setting of the unselected word line potential VWu ranges from fine to coarse. However, fineness of setting of the unselected word line potential VWu need only be selected according to a specification required of the nonvolatile semiconductor memory device to be manufactured.

As is clear from the above, the present embodiment enables the reverse direction bias applied to the unselected memory cells to be made smaller than when all of the unselected word lines are set to the same potential. As a result, the sneak current during the access operation can be reduced, hence a nonvolatile semiconductor memory device in which power consumption is proportionately reduced can be provided.

Note that for ease of understanding, the present embodiment was described using specific values for potentials of the word lines and bit lines and so on, but the present embodiment is applicable without being limited to these values.

Second Embodiment

In the first embodiment, the unselected word line potential during the access operation was adjusted according to the position (row address) of the relevant unselected word line within the memory cell array. However, in order to prevent mistakenly accessing an unselected memory cell, magnitude of the selected bit line potential must be considered when adjusting the unselected word line potential.

Accordingly, in the second embodiment, the unselected word line potential is adjusted in view of not only the position of the unselected word line within the memory cell array but also the magnitude of the selected bit line potential.

Specifically, the potential VWu of the unselected word lines WLu is adjusted such that a potential difference VBs–VWu between the selected bit line BLs and an unselected word line WLu increases the more toward the center of the memory cell array in the column direction that said unselected word line WLu is located.

Figure 7:
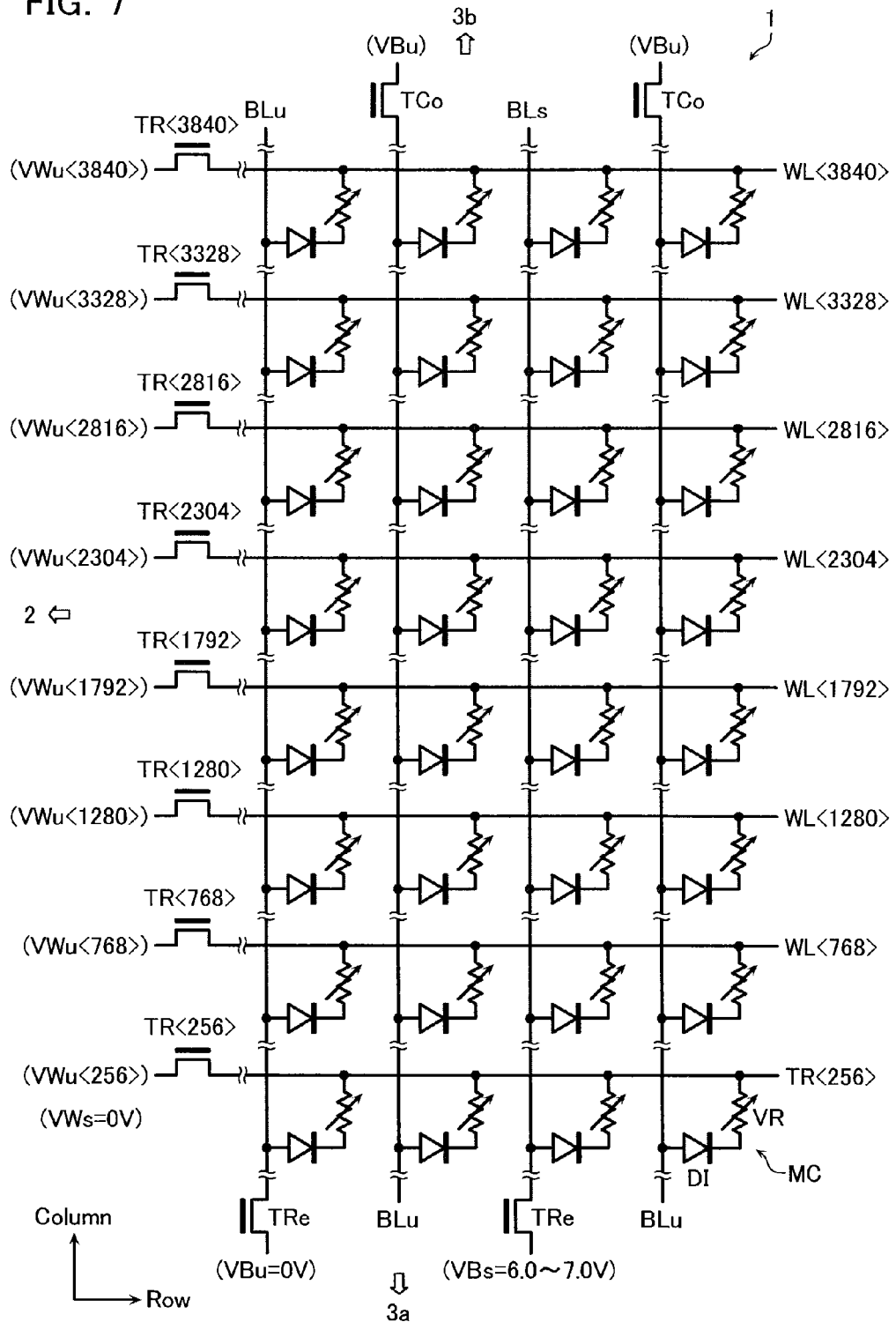
FIG. 7 is a view showing a bias state of a memory cell array in a nonvolatile semiconductor memory device according to a second embodiment.

FIG. 7 is a view showing a bias state of the memory cell array 1 in the present embodiment.

Several specific examples of the present embodiment are described below, and it is assumed that, during the access operation in these specific examples, the selected word line WLs (not illustrated) is set to the selected word line potential VWs=0 V by the row control circuit 2, and the selected bit line BLs is set to the selected bit line potential VBs and the unselected bit lines BLu are set to the unselected bit line potential VBu=0 V by the column control circuits 3a and 3b. Now the selected bit line potential VBs is a potential adjusted in view of the position of the selected memory cell MCs within the memory cell array 1 and so on, and is here assumed to be adjusted in a range of 6.0~7.0 V, for example.

Figure 8:
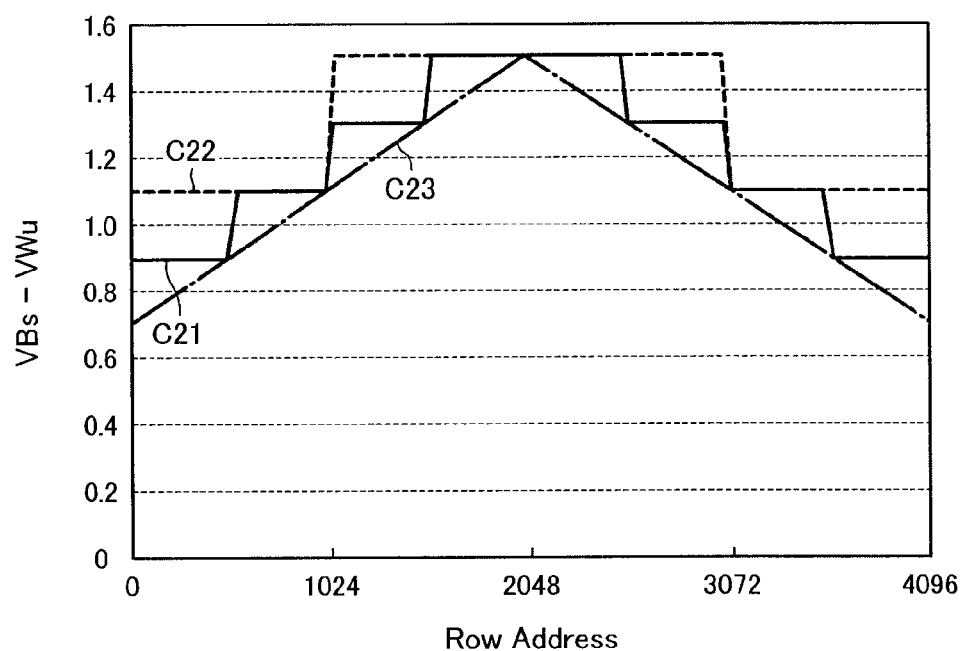
FIG. 8 is a graph showing a relationship between a row address and a potential difference between an unselected word line to which this row address is allocated and a selected bit line, in the nonvolatile semiconductor memory device according to the same embodiment.

Moreover, as shown in FIG. 8, in the present embodiment, the unselected word line potential VWu to which the unselected word lines WLu are set is adjusted by the row control circuit 2.

FIG. 8 is a graph showing a relationship between the row address and the potential difference between the unselected word line WLu to which this row address is allocated and the selected bit line BLs.

In the case of specific example C21 in the present embodiment (solid line in FIG. 8), the unselected word line potential VWu is set in the unselected word lines WLu by the row control circuit 2 such that a potential difference between the unselected word lines WLu of group GWL1 and the selected bit line BLs is VBs–VWu=1.5 V, a potential difference between the unselected word lines WLu of group GWL2 and the selected bit line BLs is VBs–VWu=1.3 V, a potential difference between the unselected word lines WLu of group GWL3 and the selected bit line BLs is VBs–VWu=1.1 V, and a potential difference between the unselected word lines WLu of group GWL4 and the selected bit line BLs is VBs–VWu=0.9 V.

In the case of specific example C22 in the present embodiment (broken line in FIG. 8), the unselected word line potential VWu is adjusted in the unselected word lines WLu by the row control circuit 2 such that a potential difference between the unselected word lines WLu of group GWL1 or GWL2 and the selected bit line BLs is VBs–VWu=1.5 V, and a potential difference between the unselected word lines WLu of group GWL3 or GWL4 and the selected bit line BLs is VBs–VWu=1.1 V.

In the case of specific example C23 in the present embodiment (dashed-single dotted line in FIG. 8), the unselected word line potential VWu with respect to the unselected word lines WLu is set in a range of 0.7~1.5 V by the row control circuit 2 such that the potential difference VBs–VWu between the unselected word lines WLu and the selected bit line BLs increases continuously from the outside toward the center of the memory cell array 1 in the column direction, irrespective of group GWL.

Focusing only on the unselected word line potential VWu, specific examples C21~C23 in the present embodiment are similar to specific examples C11~C13 in the first embodiment in that the potential VWu of the unselected word lines WLu becomes lower from the outside toward the center of the memory cell array 1 in the column direction. In that respect, specific examples C21~C23 in the present embodiment have similar advantages to specific examples C11~C13 in the first embodiment, respectively.

Furthermore, in the case of specific examples C21~C23 in the present embodiment, even when for example the potential VBs of the selected bit line BLs is adjusted according to the position of the selected memory cell, the unselected word line potential VWu is adjusted to conform with this, hence a bias relationship between the unselected word lines WLu and the selected bit line BLs can be maintained.

As is clear from the above, the present embodiment enables provision of a nonvolatile semiconductor memory device that not only has similar advantages to those of the first embodiment but can also maintain the bias relationship between the unselected word lines and the selected bit line regardless of a change in the selected bit line potential.

Note that for ease of understanding, the present embodiment was described using specific values for potentials of the word lines and bit lines and so on, but the present embodiment is applicable without being limited to these values.

Third Embodiment

Both the first and second embodiments described the case where adjustment of the potential of the unselected word lines is performed by the row control circuit. However, the third embodiment describes the case where the potential of the unselected word lines is adjusted by a size of select transistors connected to the word lines.

Figure 9:
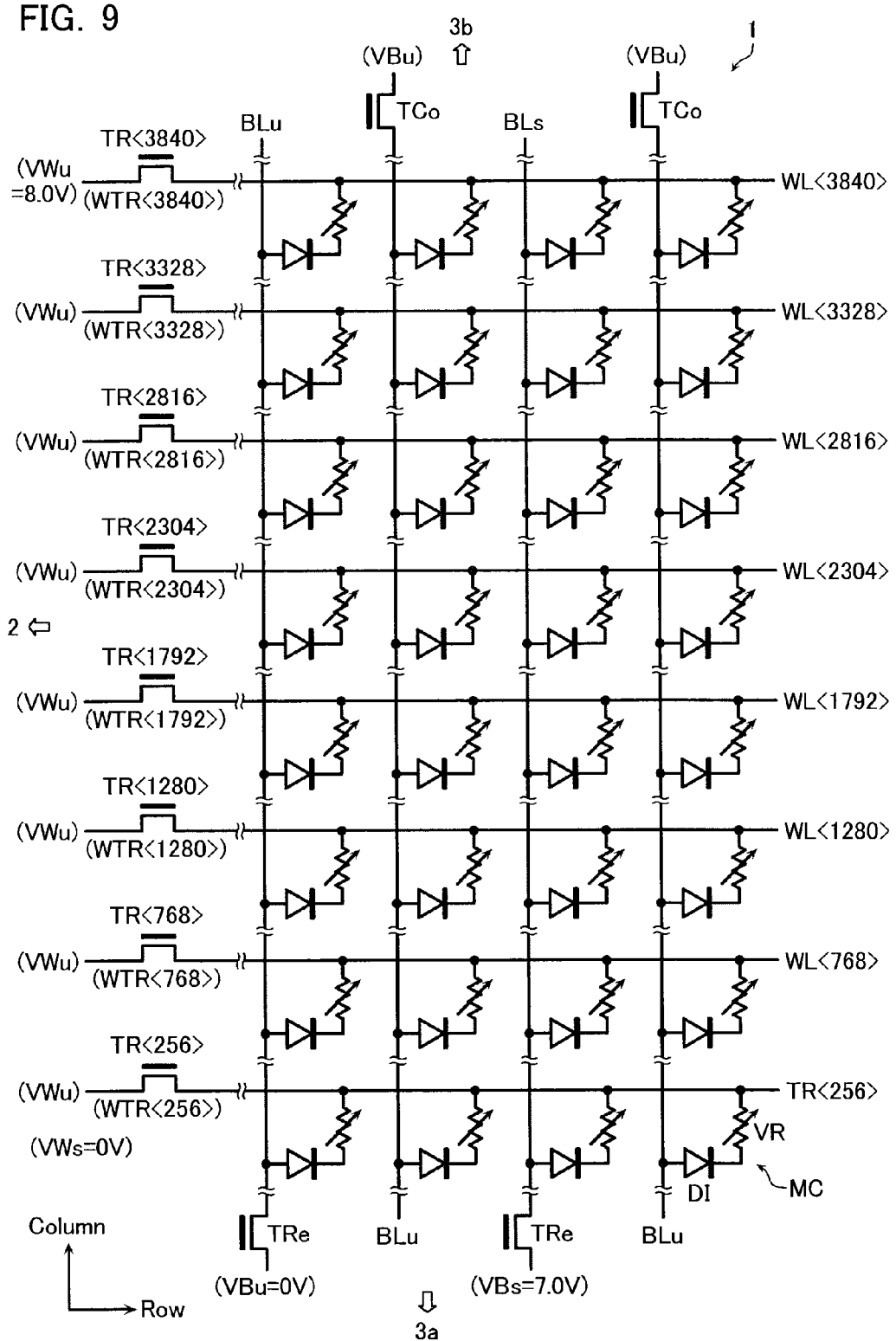
FIG. 9 is a view showing a bias state of a memory cell array in a nonvolatile semiconductor memory device according to a third embodiment.

FIG. 9 is a view showing a bias state of the memory cell array 1 in the present embodiment.

Several specific examples of the present embodiment are described below, and it is assumed that, during the access operation in these specific examples, the selected word line WLs (not illustrated) is set to the selected word line potential VWs=0 V and the unselected word lines WLu are set to the unselected word line potential VWu=8.0 V by the row control circuit 2, and the selected bit line BLs is set to the selected bit line potential VBs=7.0 V and the unselected bit lines BLu are set to the unselected bit line potential VBu=0 V by the column control circuits 3a and 3b. Note it is assumed that gate widths of select transistors TC connected to the bit lines BL are each formed with WTC=1.2 μm.

Figure 10:
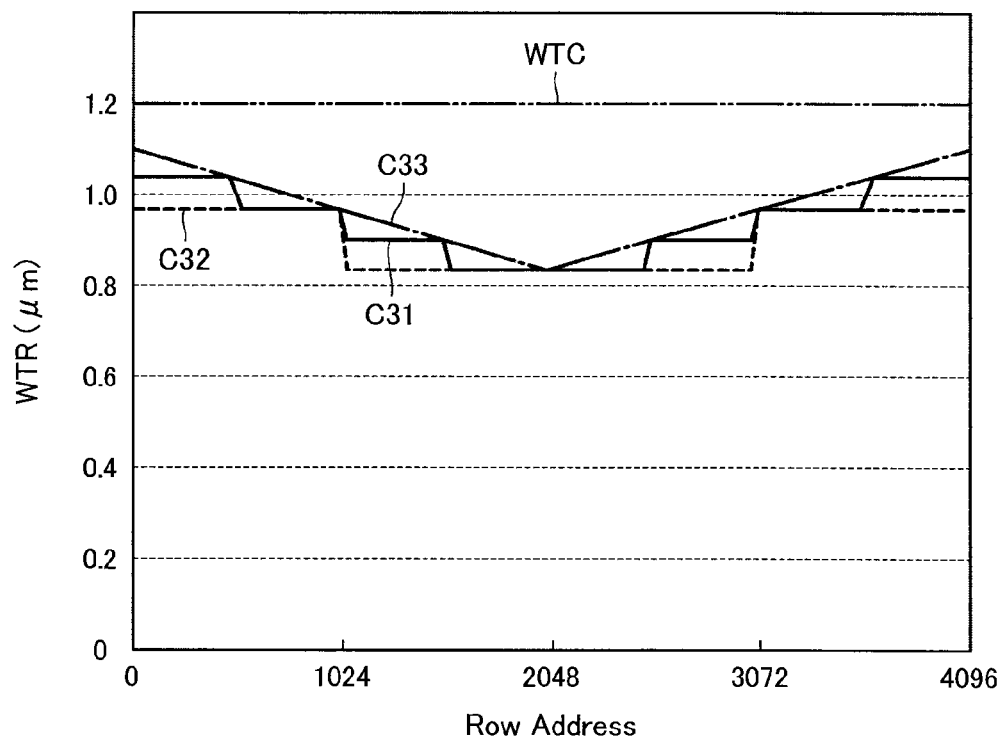
FIG. 10 is a graph showing a relationship between a row address and a gate width of a select transistor connected to a word line to which this row address is allocated, in the nonvolatile semiconductor memory device according to the same embodiment.

Moreover, in the present embodiment, select transistors TR connected to the word lines WL are formed with gate widths WTR shown in FIG. 10

FIG. 10 is a graph showing a relationship between the row address and the gate width WTR of the select transistor TR connected to the word line WL to which this row address is allocated.

In the case of specific example C31 in the present embodiment (solid line in FIG. 10), the gate width of the select transistors TR connected to the word lines WL in group GWL1 is formed with WTR=0.83 μm, the gate width of the select transistors TR connected to the word lines WL in group GWL2 is formed with WTR=0.90 μm, the gate width of the select transistors TR connected to the word lines WL in group GWL3 is formed with WTR=0.97 μm, and the gate width of the select transistors TR connected to the word lines WL in group GWL4 is formed with WTR=1.04 μm.

In other words, the select transistors TR are formed such that the gate width WTR of the select transistors connected to the word lines WL narrows in stages from the outside toward the center of the memory cell array 1 in the column direction. Moreover, since an on-resistance of a select transistor TR becomes larger the more its gate width WTR narrows, it becomes more difficult for the potential VWu to be applied to an unselected word line WLu the closer to the center of the memory cell array 1 that the unselected word line WLu is. As a result, even if the potential of the unselected word lines WLu is set uniformly to VWu=8.0 V, the potential of the unselected word lines WLu lowers the closer to the center of the memory cell array 1 that the unselected word lines WLu are. In other words, focusing only on the unselected word line potential VWu, similar advantages to those of specific example C11 in the first embodiment can be obtained.

In the case of specific example C32 in the present embodiment (broken line in FIG. 10), the gate width of the select transistors TR connected to the word lines WL in groups GWL1 and GWL2 is formed with WTR=0.83 μm, and the gate width of the select transistors TR connected to the word lines WL in groups GWL3 and GWL4 is formed with WTR=0.97 μm.

In the case of this specific example C32, two stages of the unselected word line potential VWu are present, namely for the unselected word lines WLu of groups GWL1 and GWL2 and the unselected word lines WLu of groups GWL3 and GWL4. Therefore, similar advantages to those of specific example C12 in the first embodiment can be obtained.

In the case of specific example C33 in the present embodiment (dashed-single dotted line in FIG. 10), the select transistors TR are formed such that the gate width of the select transistors TR connected to the word lines WL decreases continuously from the outside toward the center of the memory cell array 1 in the column direction in a range of 0.83-1.1 μm, irrespective of group GWL.

In the case of this specific example C33, the potential VWu of the unselected word lines WLu decreases continuously from the outside toward the center of the memory cell array 1 in the column direction. Therefore, similar advantages to those of specific example C13 in the first embodiment can be obtained.

As is clear from the above, the present embodiment enables similar advantages to those of the first embodiment to be obtained even when the row control circuit cannot be made more complicated.

Note that for ease of understanding, the present embodiment was described using specific values for gate widths of the select transistors and so on, but the present embodiment is applicable without being limited to these values.

[Other]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:

a memory cell array including a plurality of first lines extending in a row direction, a plurality of second lines extending in a column direction, and a plurality of memory cells provided at each of intersections of the plurality of first lines and the plurality of second lines; and a control unit including a row control circuit configured to control a potential of the plurality of first lines, a first column control circuit provided on a side of one ends of the plurality of second lines and configured to control a potential of a plurality of those of said plurality of second lines that are aligned in even-numbered positions, and a second column control circuit provided on a side of the other ends of the plurality of second lines and configured to control a potential of a plurality of those of said plurality of second lines that are aligned in odd-numbered positions, when, of the plurality of memory cells, a memory cell which is to be an access target is assumed to be a selected memory cell and the other memory cells are assumed to be unselected memory cells, the control unit, during an access operation, controlling a potential of the plurality of first lines and the plurality of second lines such that a bias, which is lower than that applied to a certain unselected memory cell, is applied to those of the unselected memory cells that are located more toward a center of the memory cell array in the column direction than the certain unselected memory cell.

2. The nonvolatile semiconductor memory device according to claim 1, wherein when, of the plurality of first lines, a first line connected to the selected memory cell is assumed to be a selected first line and the other first lines are assumed to be unselected first lines, and, of the plurality of second lines, a second line connected to the selected memory cell is assumed to be a selected second line and the other second lines are assumed to be unselected second lines, the control unit, during the access operation, sets the selected second line to a higher potential than the selected first line and sets those of the unselected first lines that are located more toward the center of the memory cell array in the column direction than a certain unselected first line to a lower potential than the certain unselected first line.

3. The nonvolatile semiconductor memory device according to claim 2, wherein the control unit, during the access operation, sets a potential of the unselected first lines to lower continuously from an outside toward the center of the memory cell array in the column direction.

4. The nonvolatile semiconductor memory device according to claim 2, wherein the control unit, during the access operation, sets a potential of the unselected first lines to lower in stages from an outside toward the center of the memory cell array in the column direction.

5. The nonvolatile semiconductor memory device according to claim 4, wherein
the control unit sets the potential of the unselected first lines in two stages.

6. The nonvolatile semiconductor memory device according to claim 2, wherein
each of the memory cells is configured from a variable resistance element and a rectifier element connected in series.

7. The nonvolatile semiconductor memory device according to claim 6, wherein
each of the memory cells has one of the second lines connected to an anode side of the rectifier element and one of the first lines connected to a cathode side of the rectifier element.

8. The nonvolatile semiconductor memory device according to claim 2, wherein
the control unit controls the potential of the second lines based on a row address allocated to each of said second lines.

9. A nonvolatile semiconductor memory device, comprising:
a memory cell array including a plurality of first lines extending in a row direction, a plurality of second lines extending in a column direction, and a plurality of memory cells provided at each of intersections of the plurality of first lines and the plurality of second lines; and
a control unit including a row control circuit configured to control a potential of the plurality of first lines, a first column control circuit provided on a side of one ends of the plurality of second lines and configured to control a potential of a plurality of those of said plurality of second lines that are aligned in even-numbered positions, and a second column control circuit provided on a side of the other ends of the plurality of second lines and configured to control a potential of a plurality of those of said plurality of second lines that are aligned in odd-numbered positions,
when, of the plurality of memory cells, a memory cell which is to be an access target is assumed to be a selected memory cell and the other memory cells are assumed to be unselected memory cells, of the plurality of first lines, a first line connected to the selected memory cell is assumed to be a selected first line and the other first lines are assumed to be unselected first lines, and, of the plurality of second lines, a second line connected to the selected memory cell is assumed to be a selected second line and the other second lines are assumed to be unselected second lines,
the control unit, during an access operation, setting the selected second line to a higher potential than the selected first line and setting a potential difference, which is larger than that set between a certain unselected first line and unselected second line, between those of the unselected first lines and unselected second lines that are located more toward a center of the memory cell array in the column direction than the certain unselected first line and unselected second line.

10. The nonvolatile semiconductor memory device according to claim 9, wherein
the control unit, during the access operation, sets a potential difference between the unselected first lines and unselected second lines to increase continuously from an outside toward the center of the memory cell array in the column direction.

11. The nonvolatile semiconductor memory device according to claim 9, wherein
the control unit, during the access operation, sets a potential difference between the unselected first lines and unselected second lines to increase in stages from an outside toward the center of the memory cell array in the column direction.

12. The nonvolatile semiconductor memory device according to claim 11, wherein
the control unit sets the potential difference between the unselected first lines and unselected second lines in two stages.

13. The nonvolatile semiconductor memory device according to claim 9, wherein
each of the memory cells is configured from a variable resistance element and a rectifier element connected in series.

14. The nonvolatile semiconductor memory device according to claim 13, wherein
each of the memory cells has one of the second lines connected to an anode side of the rectifier element and one of the first lines connected to a cathode side of the rectifier element.

* * * * *